US005355048A

United States Patent [19]

Estes

[11] Patent Number: 5,355,048

[45] Date of Patent: Oct. 11, 1994

[54] MEGASONIC TRANSDUCER FOR CLEANING SUBSTRATE SURFACES

[75] Inventor: Bruce M. Estes, Apple Valley, Minn.

[73] Assignee: FSI International, Inc., Chaska, Minn.

[21] Appl. No.: 94,780

[22] Filed: Jul. 21, 1993

[51] Int. Cl.[5] .......... H01L 41/08

[52] U.S. Cl. .......... 310/334; 310/327; 310/340; 134/134

[58] Field of Search .......... 310/334–337, 310/327, 340; 134/1, 134, 147, 184; 366/127

[56] References Cited

U.S. PATENT DOCUMENTS

| | | | |
|---|---|---|---|
| 2,814,575 | 11/1957 | Lange, Jr. | 310/334 |
| 3,893,869 | 7/1975 | Mayer et al. | 134/86 |
| 4,211,948 | 7/1980 | Smith et al. | 310/334 X |
| 4,543,130 | 9/1985 | Shwartzman | 134/1 |
| 4,649,525 | 3/1987 | Angona et al. | 310/340 X |
| 4,656,384 | 4/1987 | Magori | 310/334 |
| 4,736,760 | 4/1988 | Coberly et al. | 134/134 |
| 4,737,759 | 4/1988 | Stopkay et al. | 340/52 |
| 4,771,205 | 9/1988 | Mequio | 310/334 |
| 4,804,007 | 2/1989 | Bran | 134/184 |
| 4,869,278 | 9/1989 | Bran | 134/134 |
| 4,939,405 | 7/1990 | Okuyama et al. | 310/340 X |

OTHER PUBLICATIONS

1984, Dow Corning Corporation, Information About High Technology Silicone Materials, Sylgard 184 Silicone Elastomer, Base & Curing Agent—4 Pages.

1980, Dow Corning Corporation, Information About High Technology Silicone Materials, Sylgard Prime Coat, 2 Pages.

1987, Dow Corning Corporation, Information About Specialty Materials For High Technology Applications, Dow Corning Q3-6093 Silicone Adhesive, 1 page, front and back.

Jun. 13, 1989 Purchase Order, Vendor FSI International, Ontario, California, P.O. Box #7432 1794 (Admitted Prior Art–No Drawings Available) 3 pages.

Feb. 18, 1991, Top Mount Liquid Coupled Transducer Array, 8 pages, (Admitted Prior Art), See Information Disclosure Statement.

Nov. 15, 1990, Dexian Zhang, David Kittelson, Benjamin Liu, Published Paper entitled "Characterization of Acoustic Field in a Megasonic Cleaner", University of Minnesota, Minneapolis, Minn., 14 pages (Admitted Prior Art).

(List continued on next page.)

*Primary Examiner*—Mark O. Budd

*Attorney, Agent, or Firm*—Palmatier, Sjoquist & Helget

[57] ABSTRACT

A megasonic transducer for generating and transmitting megasonic acoustic energy into a water based liquid solution for cleaning particles from substrates immersed in the solution, and having piezo crystals connected to a high frequency electrical power supply and generating 0.5 Megahertz to 2.0 Megahertz acoustic energy, a rigid backing layer secured to the back sides of the crystals by a bonding layer, both the backing layer and the bonding layer having thicknesses approximately equaling an odd number of one-quarter wavelengths of the megasonic frequency being propagated in the backing and bonding layers, a quartz isolation layer between the front faces of the piezo crystals and the liquid solution and having a thickness approximately equaling an even number of one-quarter wavelengths of the megasonic frequency propagated in the isolation layer, an encapsulation layer of an electrically insulating material with an acoustical impedance of less than water and free of air bubbles and applied onto the front faces of the piezo crystals, the encapsulation layer having a thickness substantially equaling an odd number of one-quarter wavelengths of the megasonic frequency propagated in the encapsulation layer, and a deionized water coupling layer flowing between the encapsulation layer and the isolation layer and having a thickness substantially equaling an even number of one-quarter wavelengths of the megasonic frequency propagated in the liquid coupling layer.

18 Claims, 8 Drawing Sheets

OTHER PUBLICATIONS

Undated A. R. Selfridge and S. Gehlbach, Published Paper entitled "KLM Transducer Model Implementation Using Transfer Matrices", Ultrasonic Devices, Inc., Palo Alto, Calif. and Kesa Corp., Sanata Clara, Calif., 3 pages (Admitted Prior Art).

May, 1985, Alan R. Selfridge, Approximate Material Properties In Isotropic Materials, IEEE Transactions on Sonics and Ultrasonics, vol. SU-32, No. 3, 20 pages.

(Undated) Chapter 37, Electroacoustics, Reference Data For Radio Engineers, Howard W. Sams & Co., Inc., Indianapolis, Ind., 23 pages (Admitted Prior Art).

(Undated) Herbert L. Kraus & Charles W. Bostian, Frederick H. Raab, Solid State Engineering, John Wiley & Sons, New York: Cover Page and pp. 272, 273, 274, 423 and 424 (Admitted Prior Art).

KLM TRANSMISSION LINE MODEL

MEGASONIC TRANSDUCER FOR CLEANING SUBSTRATE SURFACES

This invention relates to megasonic transducers for cleaning particles from the surfaces of wafers such as semiconductor wafers, and more particularly relates to improvements in such megasonic transducers for optimizing the performance thereof.

BACKGROUND OF THE INVENTION

Cleaning of all contaminating particles from the surfaces of semiconductor wafers being processed is highly important to obtain and maintain the integrity of circuits formed on the wafers. For the purpose of such cleaning of wafers, acoustic transducers have been used for generating megasonic energy and applying such energy to the surfaces of the wafers.

Megasonic acoustic energy is transmitted onto the wafer surfaces and particles thereon by immersing the wafers into a liquid chemical bath and directing such megasonic energy through the liquid chemical bath and onto the wafer surfaces. The application of megasonic acoustic energy reduces the depth of the boundary layer at the surface of the wafer, which boundary layer is comprised of liquid molecules near the surface to be cleaned, and more particularly, those liquid molecules whose motion is impeded by being in close proximity to the adjacent surface. Application of the megasonic acoustic energy also imparts motional energy to the small particles which normally lie within the boundary layer and are normally held tightly to the wafer surface. Such additional energy from the megasonic action helps to loosen and remove the particles.

High frequency acoustic energy is termed megasonic when frequencies range between 0.5 MHz and 2 MHz, or higher. In contrast, acoustic energy is termed ultrasonic when frequencies range from 20 KHz and higher. Using the megasonic acoustic energy is usually preferred over the ultrasonic acoustic energy because the megasonic energy poses reduced risk of cavitation damage to the wafers and is more effective in removing smaller particles which are of greatest concern in semiconductor processing.

To the present, it has been found acceptable to operate megasonic cleaning at frequencies near 850 KHz. While higher frequencies may work better with small particles, such higher frequencies may not give good results with larger particles. Laboratory results have shown that frequencies near 850 KHz are capable of cleaning and removing particles well into the submicron range.

In known megasonic cleaning devices, high frequency electrical current is applied to piezo crystals, and the physical dimensions of the crystal are changed in proportion to the amount of electrical charge which is transported into and out of the crystal structure. The resulting motion is transformed into high frequency acoustic waves when applied to a liquid chemical medium or bath, such as a chemical solution in a process tank. The acoustic waves propagate through the liquid medium according to the laws of physics relating to wave motion.

Efficient conversion of electrical energy into acoustic energy is critical to the cleaning performance of megasonic transducers. Prior art transducers require approximately 20 to 25 watts per square inch (3.10 to 3.87 watts per square centimeter) of transducer area for obtaining cleaning results from a common type of transducer configuration. Of course, the amount of energy required in order to obtain a similar level of cleaning can be interpreted as an indirect measure of cleaning efficiency, i.e., the less power required for a specified level of cleaning, the more efficient the transducer. Alternately, the higher the level of cleaning for a specified power input, the more efficient the transducer. There can be some variation in cleaning performance of different types of transducers when they are operated at the same power levels. Cleaning efficiency can be defined as the percentage of particles removed from the surfaces under the same conditions to facilitate comparisons.

One of the known prior art megasonic transducers is known as a tantalum foil transducer. The tantalum foil transducer comprises a piezo crystal to which a conductive silver epoxy layer of five mils in thickness was applied to the front surface of the crystal; and a thin tantalum foil of one mil in thickness is bonded to the epoxy layer and spaced from the crystal by the epoxy layer. The back side of the piezo crystal is exposed to air. The cleaning effect for removal of contaminating particles from the surfaces of semiconductor wafers for these tantalum foil transducers has been measured.

SUMMARY OF THE INVENTION

An object of this invention is to provide a new and improved megasonic acoustic transducer to optimize performance of the transducer configuration for the cleaning of semiconductor wafers.

Another object of the invention is to provide an improved megasonic acoustic transducer obtaining equivalent or comparable cleaning effect upon semiconductor wafers without using more power input.

Still another object of the invention is the provision of an improved megasonic acoustic transducer which is capable of being mounted to a wall of a container for the liquid chemical bath through which the megasonic acoustic energy is transmitted onto the semiconductor wafers being cleaned.

A feature of the invention is an array of piezo crystals with their front faces confronting and spaced from a liquid cleaning medium or liquid chemical bath, and isolated from the cleaning medium by an isolation layer of a chemically inert, acoustically transparent, fused quartz plate and a coupling and encapsulation medium between the piezo crystals and the isolation layer thereby eliminating any air between the crystals and the isolation layer and maintaining the air out of the space between the crystals and the isolation layer. The coupling and encapsulation medium comprises an electrically non-conductive encapsulation layer of silicone elastomer, preferably applied directly to the piezo crystals. It is important that the encapsulation layer has properties so that its acoustic impedance is less than the acoustic impedance of water, i.e., less than 1.5 MRayls and that the acoustic losses are minimized at the frequencies being utilized. The encapsulation layer is necessarily coupled to the quartz of the isolation layer such that all air is eliminated between the encapsulation and isolation layers. The back face of the crystal is adhered by a bonding layer to an aluminum panel as the backing layer adjoining the atmospheric air at the back side of the crystal. The backer may be used to mount the crystal and isolation layer adjacent the liquid cleaning medium.

In eliminating any air between the encapsulation layer and the isolation layer, a liquid coupling layer comprising deionized (DI) water or other suitable liquid may be interposed between the encapsulation layer and the isolation layer. Alternately, the encapsulation layer may be applied directly against the isolation layer without entrapping any air between said layers, and in this alternate embodiment, the encapsulation layer may comprise a silicone elastomer, or a silicon oil, or a fluorinated liquid.

The thickness of the various layers must have a direct relationship to the acoustic frequency at which the piezo crystals are operated in order to effectively transmit the acoustic energy. Taking into consideration that the acoustic energy passes through a number of different materials in the various layers of the transducer, and also taking into consideration that because of the different materials, the dimensions of the wavelengths at the operating acoustic frequency change from one material to another material because of the nature of the material. For best results at the front side of the piezo crystals, the thickness of the quartz panel in the isolation layer should be approximately a multiple of one-half wave length of the acoustic frequency; the thickness of the DI water in the liquid coupling layer should be approximately a multiple of a one-half wave length of the acoustic frequency; and the thickness of the silicone elastomer encapsulation layer should be approximately a known odd number of one-quarter wavelengths of the acoustic frequency. At the back side of the piezo crystal, the thickness of the silicone adhesive in the bonding layer should be approximately an odd number of one-quarter wavelengths of the acoustic frequency of the piezo crystal; and the thickness of the aluminum panel of the backing layer should be approximately an odd number of one-quarter wavelengths of the acoustic frequency.

It is also important in obtaining best results from the transducer, that the electrical impedance of the transducer, i.e., the relationship of the applied voltage and resulting current, must be controlled such that the zero phase point coincides with the desired operating frequency of the transducer, i.e., approximately 850 KHz. This zero phase point, at which maximum real power is delivered to the transducer, represents the anti-resonant frequency of the transducer, and in an optimum transducer design the maximum acoustic output from the transducer is desired to occur very near to this anti-resonant frequency (known as $f_a$).

Further, the electrical impedance of the transducer is desired to be approximately 50 ohms at the operating acoustic frequency of the transducer. This eliminates the need for external impedance matching devices which may be otherwise required, and thereby contributes to maintaining high efficiency of the transducer.

DETAILED SPECIFICATION OF THE PREFERRED EMBODIMENT

Figure 1:
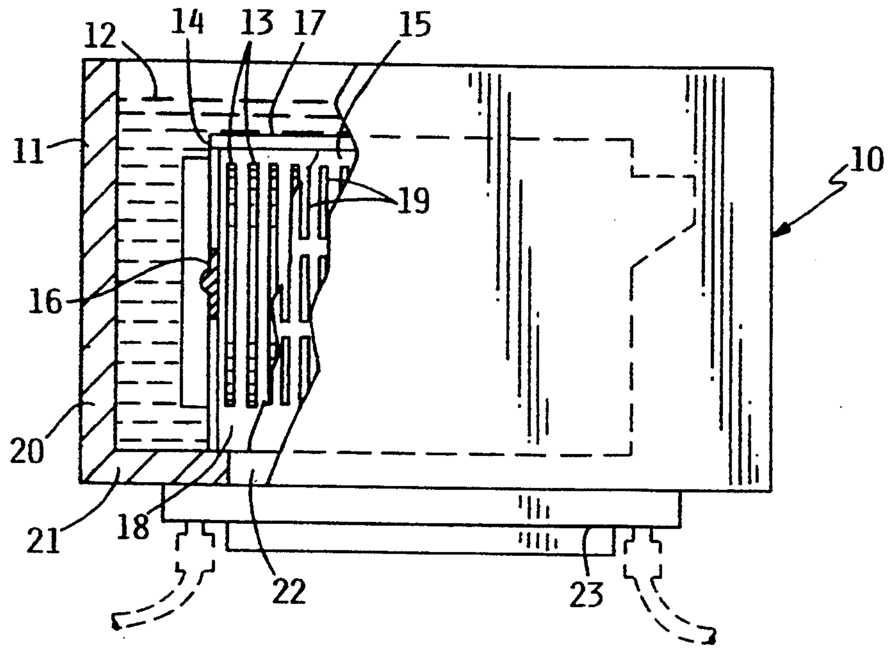
FIG. 1 is a diagrammatic illustration showing a megasonic transducer mounted on a tank containing a solution of cleaning liquid in which a number of semiconductor wafers or substrates carried by a wafer carrier have been immersed in the cleaning solution.

A megasonic cleaning device, indicated in general by numeral 10, is illustrated in FIG. 1 and includes a vessel or tank 11 with an open top and containing a quantity of cleaning solution 12 which is a water based solution in which a multiplicity of substrates or wafer carriers 13 are immersed. The substrates or wafers 13 are confined in a wafers or cassette 14 which is made of any of a number of plastics, such as a fluoropolymer material highly resistant to the deteriorating effects of corrosive chemicals. The wafer carrier has sidewalls 15 connected together by end walls 16 so as to define an open top 17 and an open bottom 18 which allows free circulation of liquid through the wafer carrier and along the substrates therein; and also allows propagation of megasonic waves upwardly along the wafers in the solution 12. The sidewalls 15 are typically apertured or slotted as illustrated at 19.

The vessel 11 has its walls 20, 21 made of any of a number of materials which will resist the deteriorating effects of highly corrosive chemicals, and a typical vessel 11 may be made of quartz, or may be made of various plastics. In the form illustrated in FIG. 1, the bottom wall 21 has an open window 22 therein to allow the high frequency acoustic energy from the transducer 23 to pass therethrough and upwardly to embrace the substrates or wafers 13 confined in the carrier and immersed in the liquid 12.

In the prior art, various transducers have been used to generate the high frequency acoustic energy propagated into and through the liquid solution 12 and to remove particles from the wafers or substrates 13.

Figure 2:
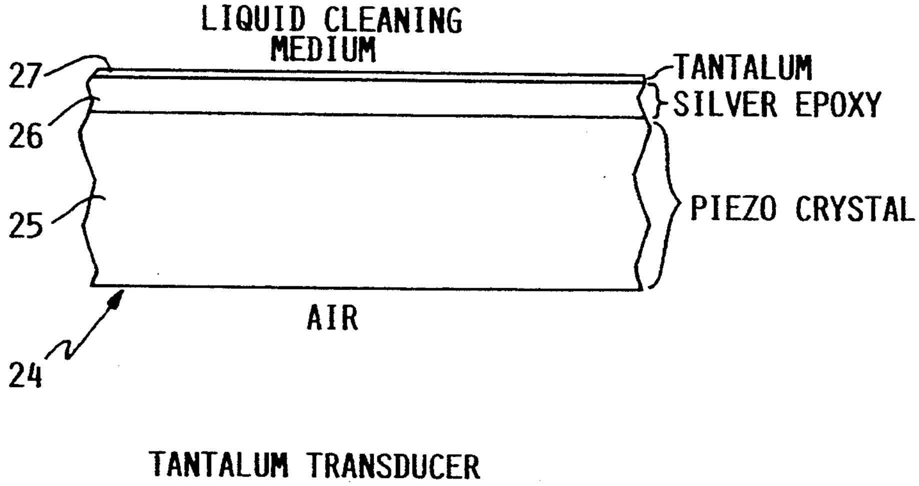
FIG. 2 (PRIOR ART)
FIG. 2 is an enlarged diagrammatic view illustrating the prior art megasonic tantalum transducer.
Figure 3:
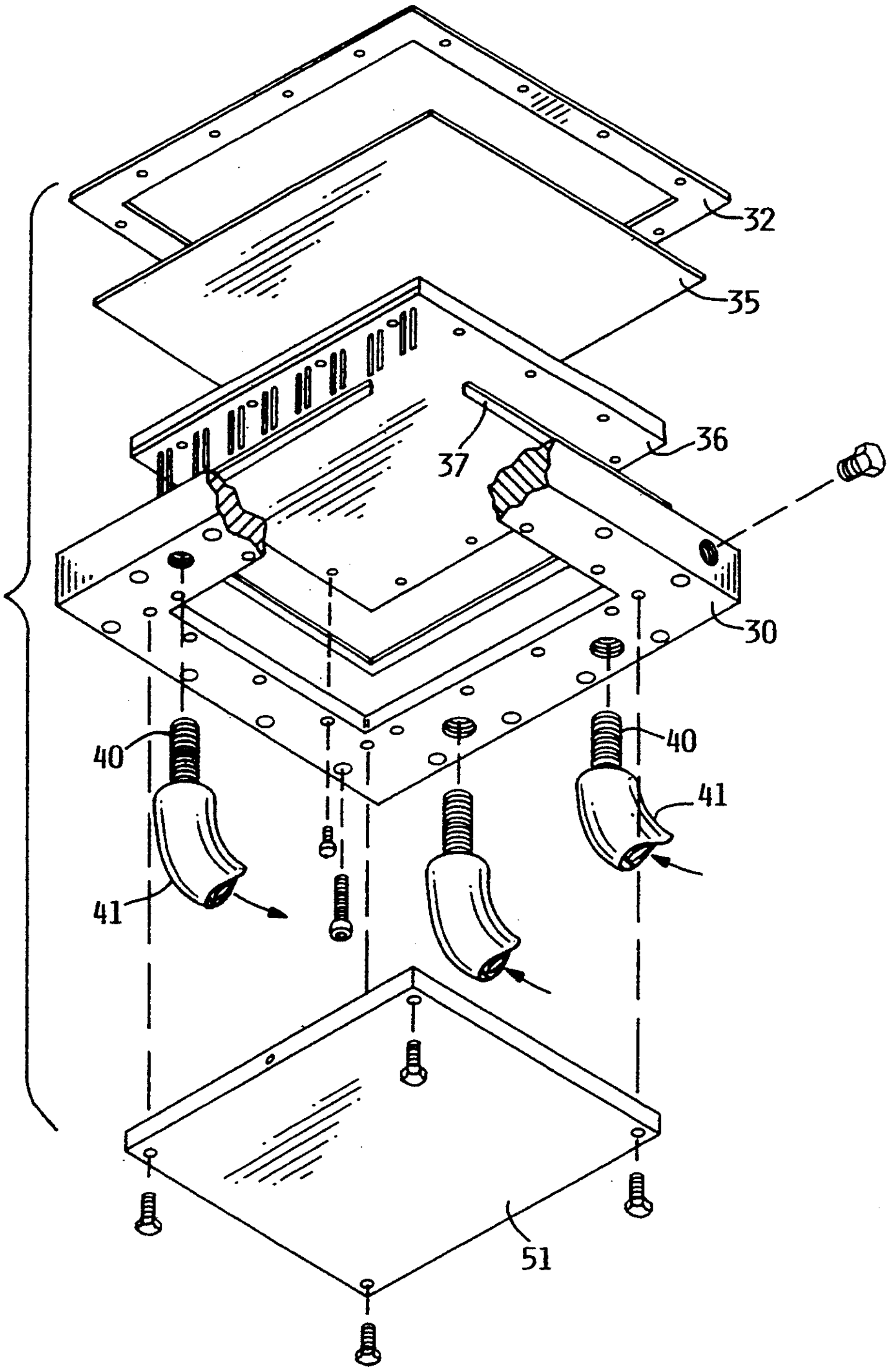
FIG. 3 is a perspective view of the principal parts of the improved transducer according to the present invention.

One known prior art transducer is illustrated in FIG. 2. The prior art tantalum transducer 24 illustrated in FIG. 2 comprises a ceramic piezo crystal 25 upon which a layer 26 of silver epoxy is placed, and an additional layer 27 of tantalum foil lies on the epoxy layer 26. In the known transducer 24, the silver epoxy layer has a thickness of five mils, enough to mechanically support foil layer 27 and to protect the crystal 25; and the tantalum foil layer 27 has a thickness of one mil.

The piezo crystals which were in a typical crystal array wherein the crystals were dimensioned six inches long by one inch wide and laid side by side, have been operated two at a time to create a column of acoustic energy approximately dimensioned six inches long by two inches wide from the transducer through the entire bath of cleaning liquid in which the substrates are immersed.

The preferred form of transducer 29 of FIGS. 3–8 will be mounted on the vessel 11 in the same manner that transducer 23 of FIG. 1 is mounted on the vessel. The transducer 29 is mounted on the bottom wall 21 of the vessel 11 and covers the entire window 22 in the bottom wall 21.

Transducer 29 comprises a generally rectangular frame molded of plastic which is highly resistant to the deteriorating effects of corrosive chemicals and may be formed of a fluoropolymer plastic such as polyvinyldefluoride (PVDF), or other fluoropolymer plastics, or similar plastics of another nature, to resist any corrosive chemicals.

The frame is mechanically mounted against the bottom side of the bottom wall 21 of the vessel or tank 11 as by screws 31 or other mechanical devices; and a gasket 32 extends entirely around the perimeter of the rectangular frame 30 as to seal the frame to the bottom wall 21. The gasket 32 is also made of a plastic which is highly resistant to the deteriorating effects of corrosive chemicals and may also be made of a fluoropolymer material such as perfluoroalkoxy, known by its trademark as Teflon® PFA. The frame 30 has a pair of shelves or supporting surfaces 33, 34 respectively supporting an isolation means or quartz layer or quartz window 35 and a piezo electric crystal assembly 36. The quartz of the quartz widow is a manufactured product which is a high purity material that is resistant to most chemicals used in typical megasonic cleaning processes. It has been found successful to use a General Electric type 124 quartz in the window 35. The quartz window 35 is also referred to as an isolation layer, and the thickness of the quartz window or isolation layer 35 is critical to the present invention and must be an integral number of one-half wavelengths of the frequency of the megasonic energy propagating through the isolation layer 35; and preferably, the isolation layer 35 has a thickness of one-half wavelength of the high frequency of the acoustic energy propagating through the isolation layer 35. As will be further emphasized herein, the frequency at which the transducer 29 operates may be between 0.5 MHz and 2.0 MHz, but preferably, the transducer operates at 850 KHz. Assuming that the transducer operates at approximately 850 KHz, or within the range of 835 KHz to 865 Kilohertz, the preferred thickness of the isolation layer 35 at one-half wavelength of the frequency of the acoustic energy propagating through the isolation layer 35 is 0.137 inch (0.348 centimeter). If transducer 29 is operated at a higher megasonic frequency, the thickness of the isolation layer 35 may need to be a longer number of one-half wavelengths, in order to provide for the needed mechanical strength of the isolation layer. The half wavelength thickness at the operating frequency causes the isolation layer 35 to be acoustically resonant at the operating frequency. The edge portions of the quartz window or isolation layer 35 are gripped by the gasket 32 as to be held stationary with respect to the frame 30.

The piezo electric crystal assembly 36 rests upon a gasket 37 that extends entirely around the periphery of frame 30 and is supported from the shoulder surface 34. Gasket 37 is also formed of a plastic which is highly resistant to the deteriorating effects of corrosive chemicals. The gasket 37 may be supplemented by shims between the shoulder surface 34 and the crystal assembly 36 in order to accurately position the crystal assembly relative to the frame 30.

A liquid coupling layer 38 comprising deionized (DI) water or other suitable liquid is located between the isolation layer 35 and the piezo electric crystal assembly 36 and is circulated continuously to carry away any air bubbles that might possibly exist and to remove heat from the transducer. The liquid coupling layer also has a thickness which is important to the present invention and comprises an integral number of one-half wavelengths; and preferably the thickness of the liquid coupling layer 38 is two and one-half wavelengths of the operating frequency of the acoustic energy propagating through the liquid coupling layer which equals 0.173 inch (0.439 centimeter). This particular thickness of the liquid coupling layer 38 is chosen in order to accommodate adequate liquid flow in the allotted space. The integral number of one-half wavelengths in the thickness of the liquid coupling layer 38 minimizes any change in the acoustical impedance between the encapsulation layer 46 and the isolation layer 35. The liquid coupling layer 38 performs three functions, to couple the acoustic energy being emitted from the piezo crystal assembly to the quartz window, to provide a method of removing heat generated by the piezo crystal during operation, and to sweep off the bubbles from the surface of the piezo crystal assembly and isolation layer.

The DI water in the liquid coupling layer 38 flows through passages 39 in the frame 30 and through fittings 40 and hose connections 41 to a recirculating pump 42 so that the liquid flows continuously during operation of the transducer 29.

The piezo electric crystal assembly 36 comprises a multiplicity of ceramic piezo electric crystals 43 supported upon a rigid aluminum metal backing or backing layer 44. Each of the piezo crystals is secured to the metal backing layer by a bonding layer 45. The backing layer 44 and the bonding layer 45 comprise a backing means 45A (see FIG. 8) supporting and conducting heat away from crystal 43. The piezo crystals 43 are encapsulated individually and cumulatively by an encapsulation layer 46. In this embodiment, the encapsulation layer 46 and the liquid coupling layer 38 comprise an acoustic energy transmitting means 38A (see FIG. 8) encapsulating the front faces of the crystals and acoustically coupling the crystals 43 to the isolation layer 35. The piezo crystals are purchased items and although they are available in various sizes, piezo crystals approximately one inch wide by six and one-half inches long have proven to be satisfactory. The electrical impedance of the crystals varies inversely with the area of the crystals. These piezo crystals, before being encapsulated, may be termed bare crystals, and each is expected to have, according to computer modeling, an electrical impedance of about 75 ohms when acoustically loaded with the liquid cleaning solution and operated at the antiresonant frequency of approximately 850 KHz. When two bare crystals are connected in parallel, a combined electrical impedance of about 37 ohms would be expected. As illustrated in diagrammatic FIG. 6, each of the crystals 43 is coated with a very thin metalized coating 43.1 at its top side and coating 43.2 at its bottom side for applying the electrical energy to the crystal. The application of high frequency electrical energy to the surfaces of the crystal energize the crystal and cause the production of high frequency acoustic energy which is propagated from the crystal. The metal coatings 43.1, 43.2 embrace portions of the input end of the crystal and facilitate the attaching of wires 47, 48 so as to connect the crystal to a high frequency power supply and controls, indicated in general by numeral 49. The bonding layer 45 between each of the crystals 43 and the rigid metal backing 44 is preferably an elastomeric adhesive and sealant. It has been found suitable to use a silicone adhesive known as the Dow Corning Q3-6093 manufactured by Dow Corning Corporation of Midland, Mich. The thickness of the bonding layer 45 is important to the present invention and is preferably equal to an odd number of one-quarter wavelengths of the frequency of the acoustic energy propagating through the bonding layer.

Where herein the word "odd" is used in relation to the number of quarter wavelengths, the intended meaning is that the number is one of the sequence of natural numbers beginning with one and counting by twos that are not divisible by two. Reference is also made herein to an even number of one-quarter wavelengths, and where the word "even" is used, the intended meaning is that the number is one of the sequence of natural numbers beginning with two and counting by twos that are exactly divisible by two.

Preferably, the thickness of the bonding layer is equal to one-quarter wavelength of the frequency of the acoustic energy propagating through the bonding layer at the operating frequency, i.e., preferably 850 KHz; said thickness of the bonding layer thereby being substantially 0.012 inch (0.30 centimeter). Whereas the thickness dimension of the bonding layer 45 influences the operating impedance and frequency of the transducer, the thickness is carefully controlled and accordingly, a thin spacing device or shim may be installed between the piezo crystal and the aluminum backing 44 to achieve the proper thickness of the bonding layer 45. Alternately, the bonding layer may be somewhat thicker, but it is preferred that the number of odd numbers of one-quarter wavelengths in the thickness be an odd number of seven or less. As hereinafter more fully described, the thickness of the rigid aluminum backing layer 44 also constitutes an odd number of one-quarter wavelengths of the acoustic energy propagating through the backing layer 44; and the one-quarter wavelength thickness of the bonding layer has an influencing effect together with the thickness of the backing layer 44 upon the operating impedance and antiresonant frequency of the transducer.

In some instances, both the bonding layer 45 and the backing layer 44 could have thicknesses which are even numbers of one-quarter wavelengths of the acoustic frequency respectively in the bonding and backing layers 45, 44. However, it is preferred that both the bonding layer 45 and the backing layer 44 have thicknesses which are odd numbers of one-quarter wavelengths of the propagated frequency.

Figure 10:
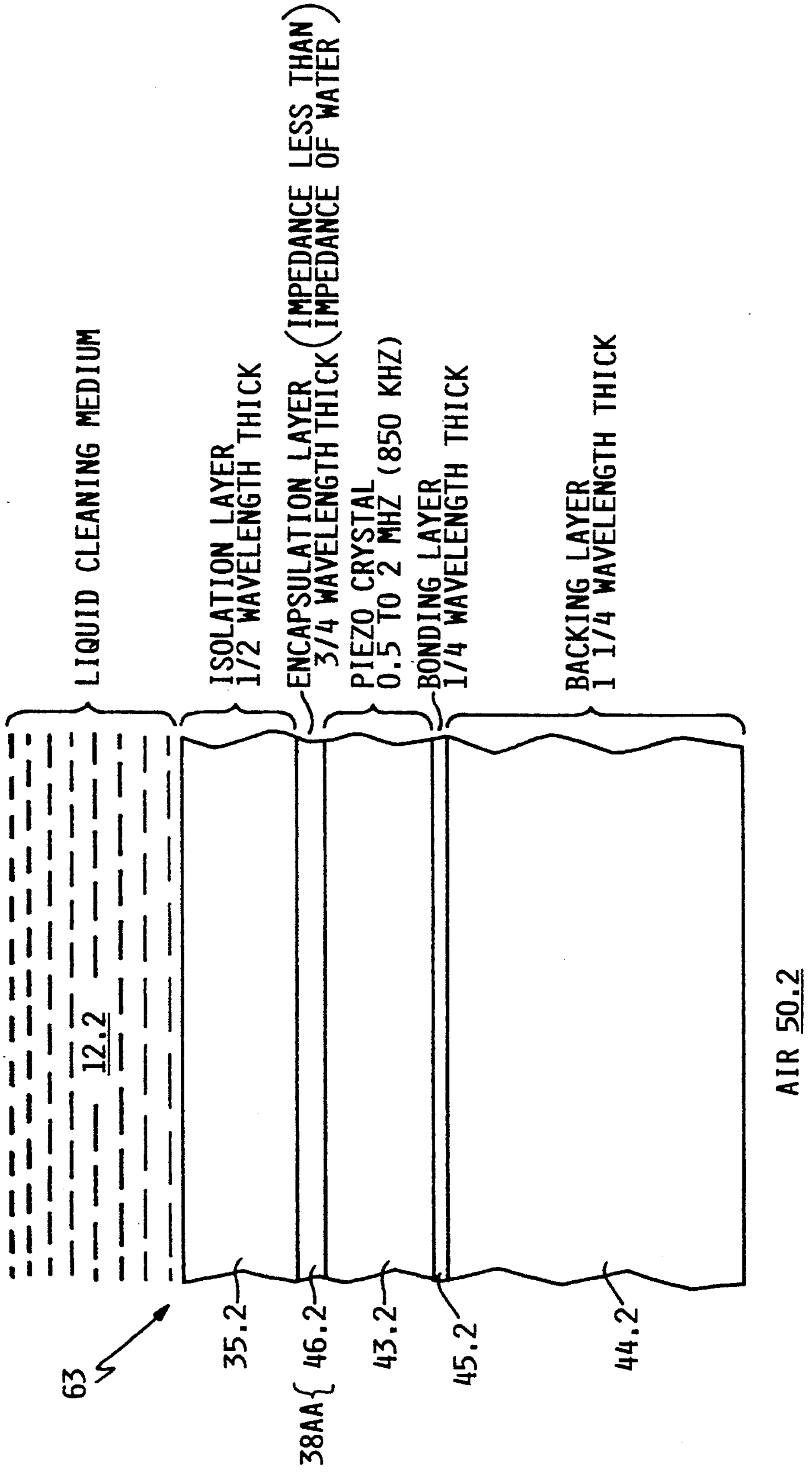
FIG. 10 is a diagrammatic illustration showing the essential details of the modified form of FIG. 9.

The backing layer 44 of the piezo electric crystal assembly 36 is preferably made of aluminum, but may also in some instances be formed of other rigid materials such as ceramic. The aluminum backing layer 44 has a thickness which is important to the present invention as to minimize its influence on the impedance and frequency of the transducer. The aluminum backing layer 44 must have an odd number of one-quarter wavelengths of the frequency of the acoustic energy propagating through the backing layer 44 and preferably the thickness of the backing layer comprises one and one-quarter wavelengths (five one-quarter wavelengths) of the operating frequency propagating the backing material; and more specifically, the preferred thickness of the backing layer 44 is 0.366 inch (0.930 centimeter) for the operating frequency of approximately 850 KHz. Varying the thickness of the aluminum backing layer 44 will slightly change the electrical impedance of the transducer; and it has been experienced that a backing layer with a thickness of 0.292 inch (0.742 cm) has changed the electrical impedance of the transducer to be close to the desired 50 ohms. The particular transducer, the operating characteristics of which are illustrated in FIG. 10, had a backing layer thickness of 0.292 inch.

Preferably, the odd number of one-quarter wavelengths in the thickness of the rigid backing layer should be seven or less.

Whereas the thicknesses of the bonding layer 45 and of the aluminum backing layer 44 are expressed in terms of odd numbers of one-quarter wavelengths of frequency, other odd numbers of one-quarter wavelengths may also be substituted, undoubtedly with lesser effect. The dimensioning of the bonding layer 45 and the backing layer 44 in odd number of one-quarter wavelengths, provides an enhancement effect upon each other and upon the propagation of high frequency acoustic energy therethrough while minimizing their influences on each other and upon the changing of the impedance of the transducer and its operating frequency. In minimizing the effect of the backing means comprising the bonding layer 45 and the backing layer 44 on the electrical characteristics of the crystal, it is preferred that both of these thicknesses should be defined in terms of odd numbers of one-quarter wavelengths; however, minimizing the effect of the backing means, i.e., the bonding layer 45 and the backing layer 44, may also be dimensioned in terms of an even number of one-quarter wavelengths, i.e., wherein each of the bonding layer 45 and the backing layer 44 may be dimensioned in terms of even numbers of one-quarter wavelengths.

The space indicated by the numeral 50 and adjoining the metal backing layer is filled with atmospheric air, or possibly other gas. The space 50 is enclosed by a cover 51 secured to the frame as by screws 52. The screws 52 are threaded into the frame 30 in alternate locations relative to the screws 52*a* which fasten the metal backing layer 44 and the entire piezo electric crystal assembly 36 to the frame 30.

Figure 4:
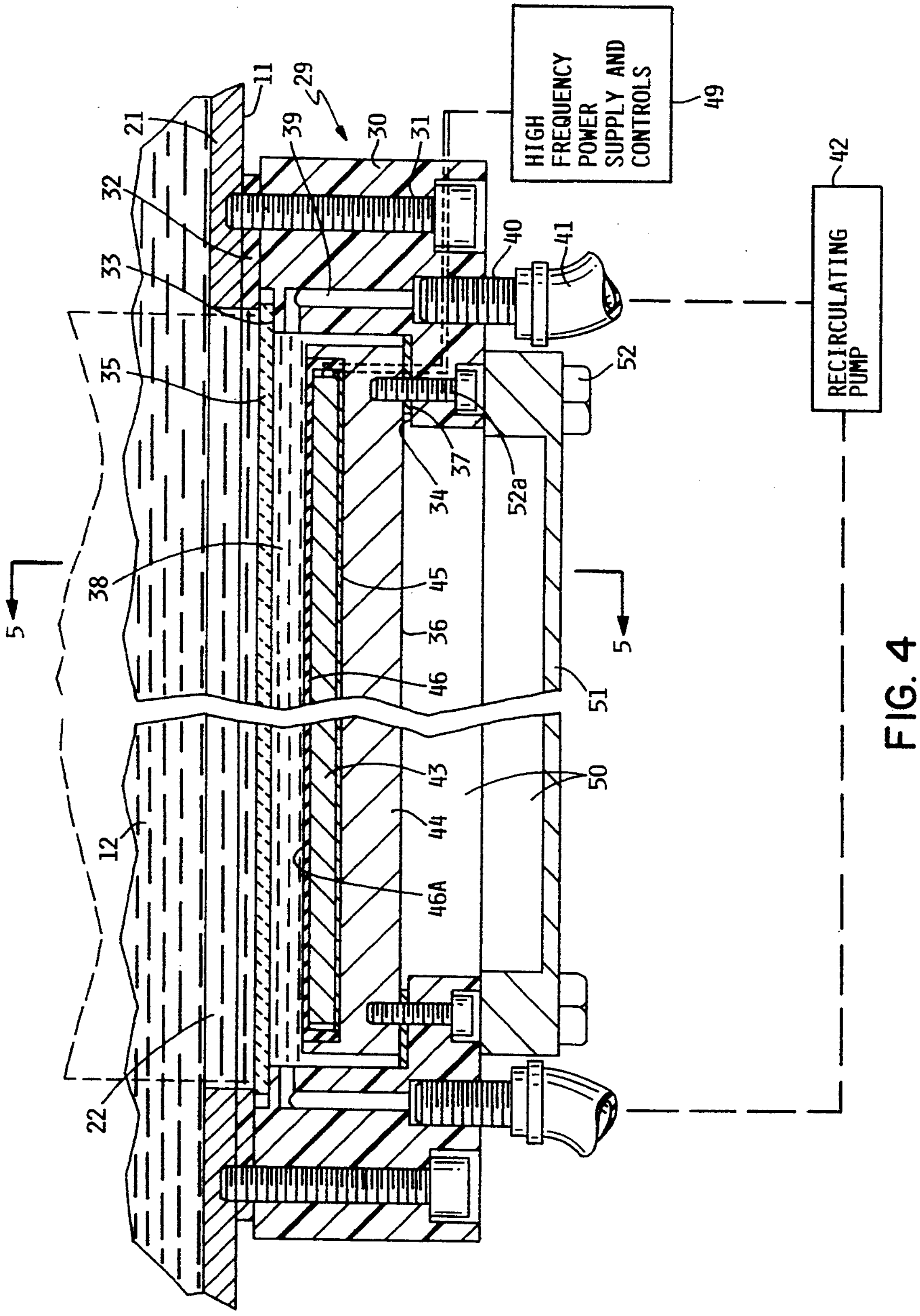
FIG. 4 is an enlarged detailed section view through the transducer of FIG. 3 and assembled onto the bottom wall of the tank in which the substrates are immersed.
Figure 5:
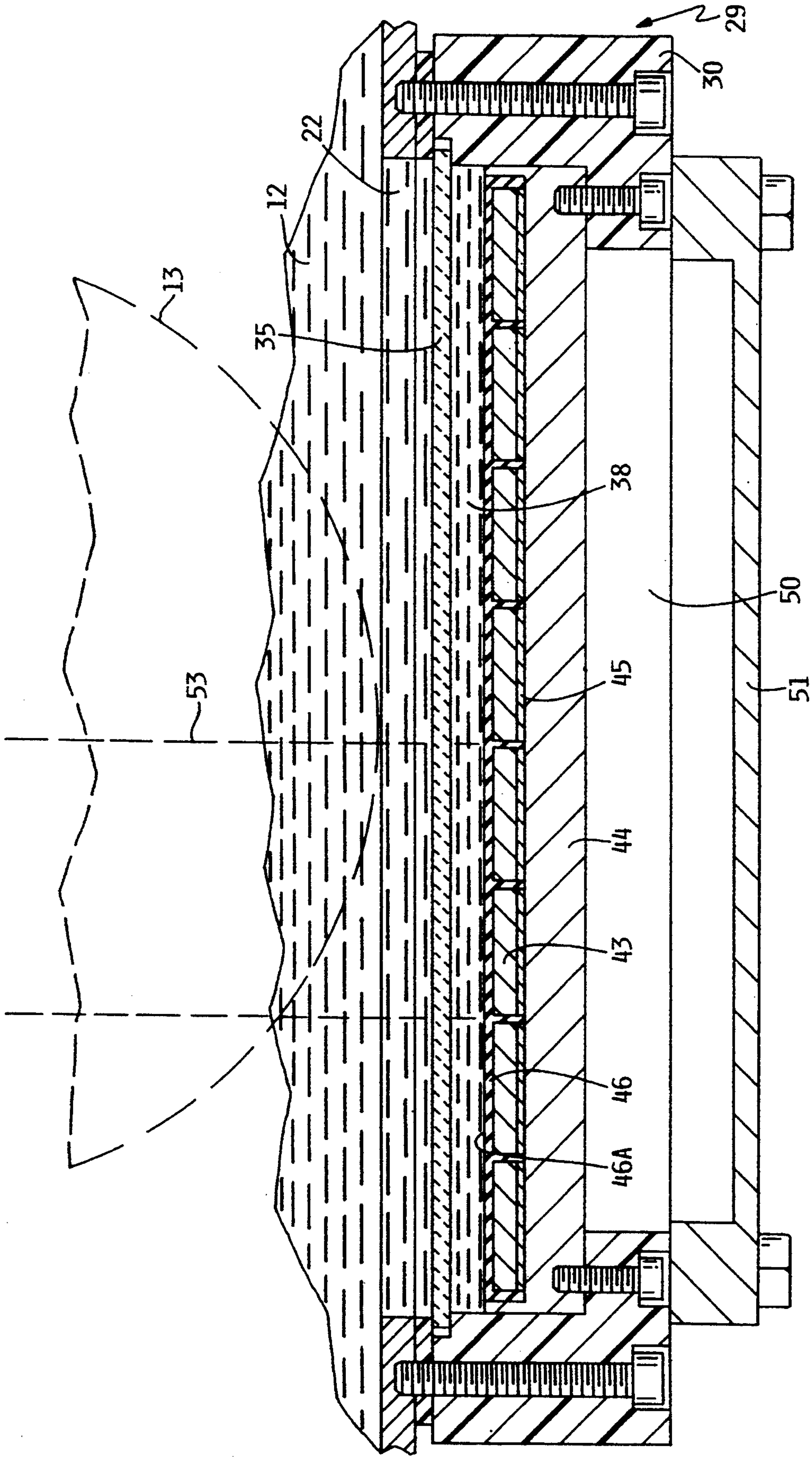
FIG. 5 is an enlarged detailed section view taken approximately at 5—5 of FIG. 4 and illustrating in phantom lines the relative position of the substrates.
Figure 6:
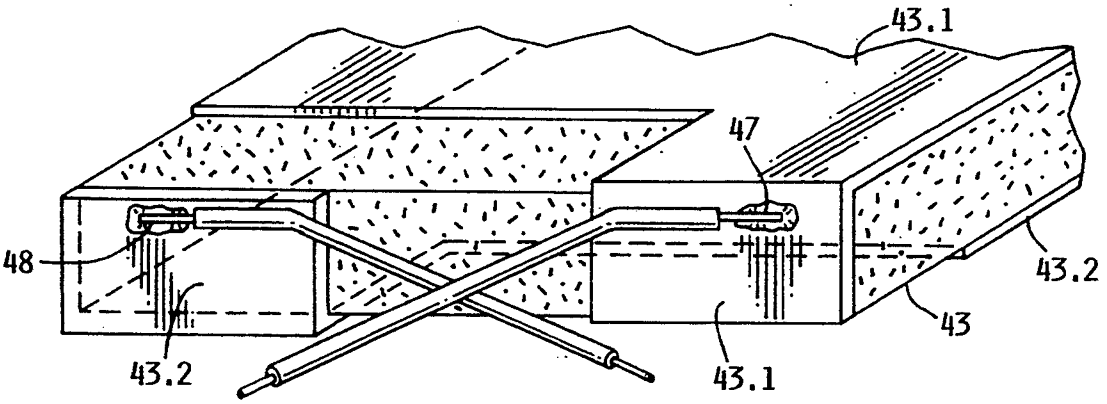
FIG. 6 is a greatly enlarged detailed perspective view illustrating the end of one of the piezo crystals for illustrating the electrical connections thereto.
Figure 7:
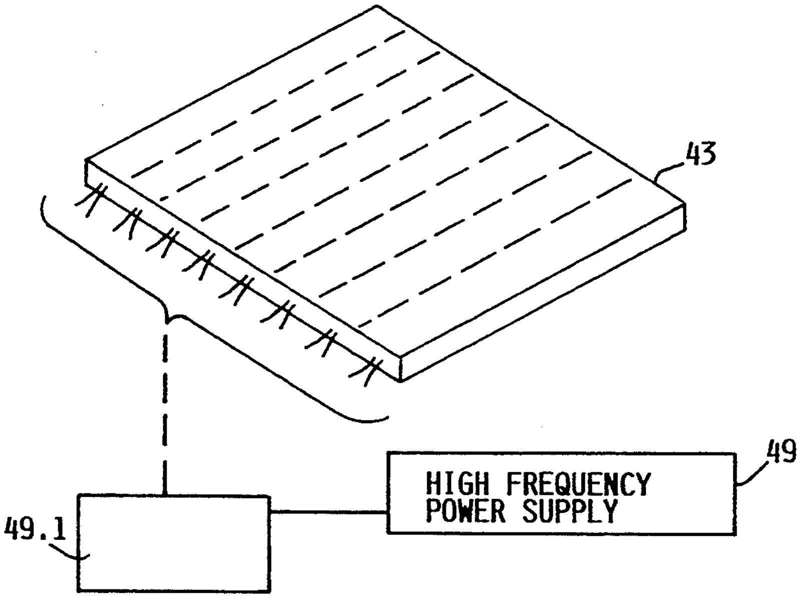
FIG. 7 is a diagrammatic illustration of electrical connections to the several piezo crystals to illustrate the operation thereof.
Figure 8:
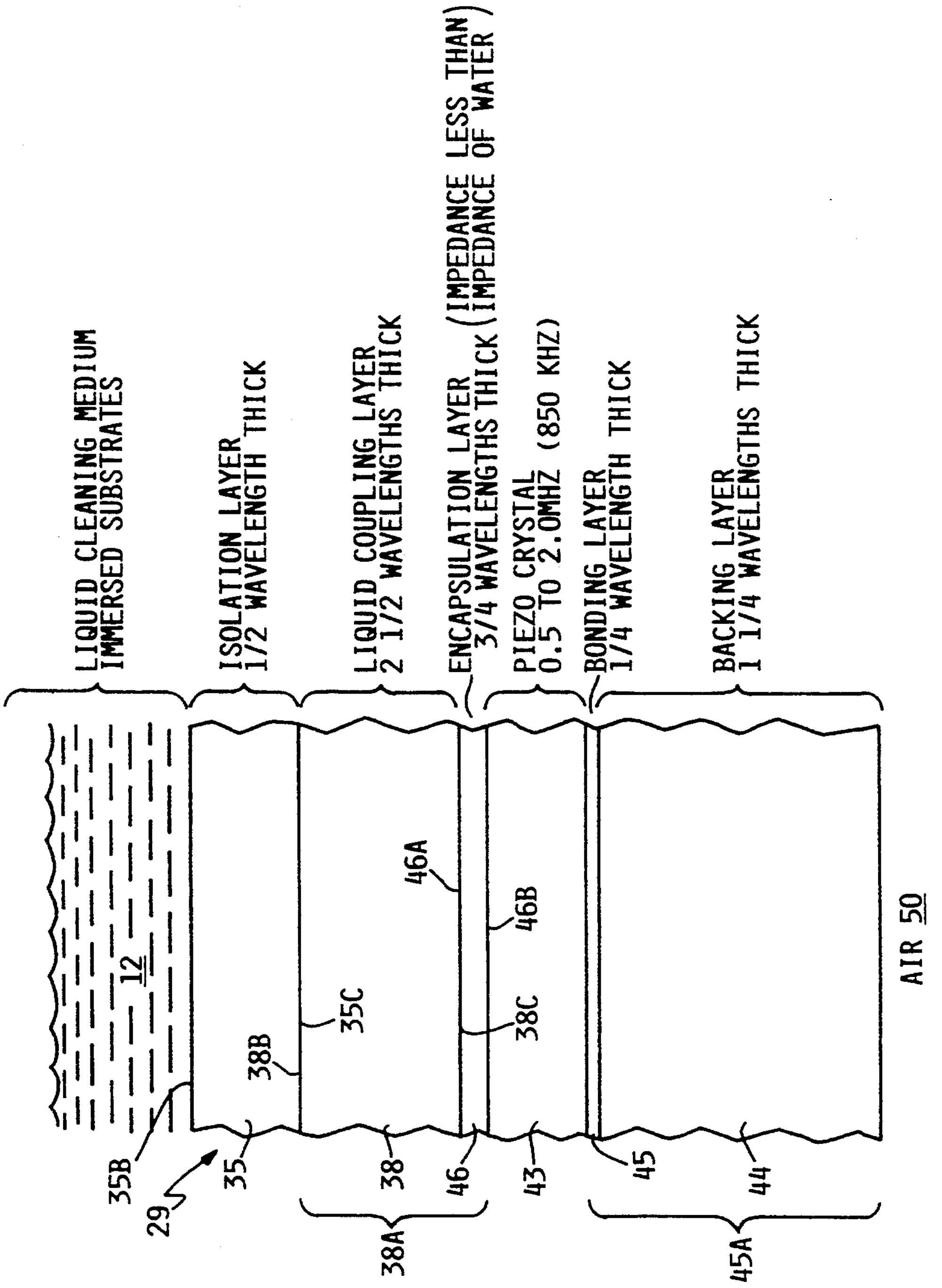
FIG. 8 is a diagrammatic illustration of the transducer of FIGS. 4 and 5 and illustrating the essential details thereof.

As illustrated in FIGS. 4 and 5, an encapsulation layer 46 overlies all of the piezo crystals 43 and electrically insulates the crystals from the liquid coupling layer 38. The encapsulation layer 46 wraps around the ends of the crystals 43 as illustrated in FIG. 4 and the encapsulation layer 46 also permeates the space between the adjacent crystals 43 and maintains the crystals in electrical isolation with respect to each other. The acoustic nature of the material in the encapsulation layer 46 and the thickness of the encapsulation layer are critical to the present invention in order to improve the electrical characteristics of the transducer for impedance matching with the high frequency power supply 49 which ordinarily has an impedance of about 50 ohms at the desired frequency of 850 KHZ; and to also avoid any frequency shift at the output of the transducer away from the operating frequency of a bare piezo crystal, i.e., not enclosed by an encapsulant. The thickness of the encapsulation layer 46 must be an odd number of one-quarter wavelengths of the operating frequency propagated through the encapsulation from the crystal 43, and preferably, in order to maintain reasonable dimensional tolerances, the thickness of the encapsulation layer should be three one-quarter wavelengths of the operating frequency of the acoustic energy propagating through the encapsulation layer.

The encapsulation layer, in addition to having the indicated odd number of one-quarter wavelengths in thickness, must also have an acoustical impedance less than the acoustical impedance of water, in order to optimize the electrical characteristic of the transducer and the acoustic response at the preferred operating frequency. The acoustical impedance of water is 1.5 MRayls. It has been found satisfactory to form the encapsulation layer 46 of a silicone elastomer known as Sylgard 184 manufactured and sold by Dow Corning Corporation, Midland, Mich., and comprised of a two-part kit consisting of liquid components to be mixed together. The silicone elastomer, Sylgard 184 has an acoustical impedance of approximately 1.0 MRayls at room temperature, which is less than the acoustic impedance of water, i.e., 1.5 MRayls. The thickness at three one-quarter wavelengths of the operating frequency propagated through the encapsulation layer equals 0.035 inch (0.089 centimeter) at the operating frequency of approximately 850 KHz. The combination of characteristics of the encapsulation layer are critical. It must be an electrically insulating material, it must have an acoustical impedance less than the acoustical impedance of water, and the encapsulation layer must have a thickness comprising an odd number, preferably three, of one-quarter wavelengths of the operating frequency in the encapsulation layer. Other silicone elastomers with acoustical impedance in the range of 0.9 to 1.4 MRayls may also be used, but those at the lower end of the range are preferred. In the event that the liquid solution 12, in which the substrates are immersed, varies significantly from pure DI water as to significantly change the acoustical impedance of the liquid solution 12, then the choice of material in the encapsulation layer 46 must change so that the acoustical impedance of the encapsulation layer is less than the acoustical impedance of the liquid solution 12, as used.

The acoustical impedances of various types of common materials is published information shown in the following Table I wherein some of the values are estimates based on the range of impedances given for similar materials.

TABLE I

| TYPICAL ACOUSTICAL IMPEDANCES OF COMMON MATERIALS (IN MRayls) | |
|---|---|
| AIR | .0004 |
| ALCOHOL | .9 |
| GASOLINE | 1.0 |
| TURPENTINE | 1.1 |
| GLYCOL | 1.7 |
| WATER | 1.5 |
| ALUMINUM | 17.3 |
| POLYURETHANE | 1.8 |
| PLASTIC | 2.4 |
| EPOXY | 3.5 |
| SILICONE RTV | 1.4 |
| OILS | 1.3 |
| QUARTZ | 13.1 |
| GLASS | 13.0 |
| TANTALUM | 54.8 |
| STAINLESS STEEL | 45.7 |
| SILVER | 38.0 |

One specific material, i.e. Sylgard 184, which has been found satisfactory is one of a multiplicity of room temperature vulcanizing (RTV) materials. Other suitable materials for use in the encapsulation layer and having an acoustical impedance (in MRayls) are defined as follows:

TABLE II

| Product Identification | Acoustical Impedance MRayls |
|---|---|
| MATERIALS FROM DOW CORNING: | |
| Sylgard 178 (a silicon rubber) | 1.34 |
| Sylgard 182 | 1.07 |
| Sylgard 186 | 1.15 |
| Dow Silastic Rubber GP45 (45 Durometer) | 1.16 |
| Dow Silastic Rubber GP 70 (70 Durometer) | 1.30 |
| OTHER RTV MATERIALS FROM GENERAL ELECTRIC: | |
| RTV-11 | 1.24 |
| RTV-21 | 1.32 |
| RTV-30 | 1.41 |
| RTV-41 | 1.32 |
| RTV-60 | 1.41 |
| RTV-602 | 1.18 |
| RTV-616 | 1.29 |
| RTV-630 | 1.30 |

In forming the encapsulation layer 46 onto the faces of the piezo crystals 43, a thin layer Dow Corning Sylgard Prime Coat, i.e., a dilute moisture-reactive solution in heptane solvent, is applied to the faces of the piezo crystals 43 in order to promote bonding between the piezo crystals and the encapsulation layer 46. The prime coat layer is so thin so that it has no appreciable effect on the acoustical output of the transducer.

In forming the encapsulation layer 46 onto the front faces of the piezo crystals 43, it is important to remove all of the air which may exist in the two-part silicone material which is used to make up the encapsulation layer. The two parts of the elastomer are measured and mixed together according to the manufacturer's recommended ratio and are placed under a vacuum of 25 to 29 inches of mercury to remove all air bubbles trapped within the mixture. All of the air must be removed because acoustic energy cannot pass through the air, and the bubbles may make holes in the protective encapsulation layer, and the holes could become passages for the coupling water to short out the crystals or otherwise form hot spots when the acoustical energy is propagated through the encapsulation layer. After the elastomer mixture of the encapsulation layer 46 is formed, the mixture is then injected into a cavity formed by a mold plate in front of the crystals 43, and allowing the air to escape as the encapsulation layer is formed. The encapsulation layer, when completely cured, must have the desired thickness in a uniform layer over the front faces of the crystals.

In order to eliminate a maximum of air in the acoustic energy transmitting means 38A, i.e., the encapsulation layer 46 and the liquid coupling layer 38, the surface 46A of the encapsulation layer 46 which impinges the liquid coupling layer 38 is treated to be hydrophilic as to be entirely wettable. Without treatment, the surface 46A of the encapsulation layer may be hydrophobic, which allows air bubbles to stick to the surface. Treatment of the surface to be hydrophilic may be accomplished in a number of processes, but one successful treatment has been to place the entire crystal array, with the encapsulation layer 46 already existing on the piezo crystals, into a cleaning oven containing an ozone-producing mercury vapor grid lamp. The ozone in the oven cleans the surface 46A and prepares the surface for a chemical reaction with a titanium butoxide liquid applied to the surface. As the titanium butoxide is wiped on the surface of the elastomer, the chemical reaction leaves the surface 46A hydrophilic, i.e., wettable, to prevent air bubbles from sticking to the surface.

When the transducer 29 is operated, high frequency electrical power is supplied from the power supply 49 to the piezo electric crystals 43. Simultaneously, the recirculating pump 42 for the DI water is operated as to circulate DI water through the liquid coupling layer 38.

The power supply 49 is required to supply a substantial amount of electrical energy, and in order to limit the size of the required power supply 49, the piezo crystals are selectively operated by a switching circuit 49.1 between the power supply 49 and the piezo crystals 43. Ordinarily, it has been found successful to operate two of the piezo crystals 43 simultaneously which generate high frequency acoustical energy propagated toward the substrates 13 in a columnar pattern indicated in FIG. 5 by the dashed lines and the numeral 53. The two crystals 43 are connected in parallel and as a result of being encapsulated have a combined electrical impedance of about 50 ohms for the size of crystals described above and at the desired operating frequency of about 850 KHz. The column 53 extends upwardly and all along the length of the piezo crystals 43 which have been energized and entirely to the top surface of the liquid solution 12 in which the substrates 13 are immersed. The intensity of the acoustic energy is substantially constant throughout the column 53 so that the portions of the substrates within the column are treated substantially equally. After a predetermined length of time during which portions of the substrates 13 are treated, the energized piezo crystals 43 are deenergized and another pair of the piezo crystals 43 are energized to essentially move the column 53 of acoustical energy to a new location for the purpose of removing the particles on other portions of the substrates.

In the event the transducer 29 is mounted at the top of vessel 11 with the isolation layer immersed in the liquid solution 12, the column 53 of acoustical energy will extend to the immersed substrates without any significant change in operation as compared to the transducer as mounted in FIG. 4.

The transmission or propagation of high frequency acoustic energy through acoustic materials, such as the several layers of material between the piezo crystals 43 and the liquid solution 12 in which the substrates 13 are immersed, has the analogous behavior of radio frequency waves in an electrical transmission line. The concepts of impedance, attenuation and the periodic nature of transmission lines is applicable to the transmission of high frequency acoustic energy through acoustic materials.

Whereas attenuation may be important for certain materials, such as soft materials which absorb acoustic energy and dissipate the energy as heat, as to render some materials unsuitable for high intensity acoustic applications, the acoustic impedance of the materials is extremely important in the propagation of high frequency acoustic waves through various materials. As the most basic property of transmission lines is the ability to transmit energy from one end to the other with minimal losses, so is the basic property of acoustic materials to be able to transmit high frequency acoustic energy through the materials with minimal losses. As is most generally the case, if the acoustic impedances at each side of the acoustic materials are different than each other, then the periodic nature of the acoustic materials becomes important in the same manner as the periodic nature of a transmission line becomes important where the impedances at each end of the transmission line are different. With electrical transmission lines, the quarter wavelengths and half wavelengths and integral multiples of these lengths have valuable properties; and in a like manner the quarter wavelengths and half wavelengths and integral multiples of these lengths also have valuable properties in the acoustic materials used in the transducer 29. Whereas a quarter wavelength section (or odd multiples of quarter wavelength sections) of a transmission line transforms the impedance at one end into a different impedance at the other end according to basic mathematical relationships, so does a quarter wavelength section as represented in the thickness of acoustic materials, or odd number multiples of one-quarter wavelength sections, also transforms the acoustic impedance at one side of the acoustic materials into a different impedance at the other side of the acoustic materials, according to basic mathematical relationships.

Similarly, whereas a half wave section, or even multiples of quarter wavelength sections, simply transfer the impedance characteristic of a transmission line existing at one end and replicates it at the other end, so does a half wavelength section, or even multiples of a quarter wavelength section, of the acoustic materials simply transfers the impedance characteristic existing at one side of the acoustic materials and replicates at the other side of the acoustic materials at a specific frequency.

It is recognized that each of the different materials in an acoustic device which are to propagate megasonic frequency acoustic energy therethrough has an acoustic impedance which is characteristic of the particular material through which the propagation occurs.

In determining the preferred thicknesses of layers in the transducer 29 in terms of wavelengths of the megasonic acoustical energy propagation in the various layers, the actual dimensions of such wavelengths must be determined. Wavelengths (in millimeters—mm) are directly related to propagation velocity (in millimeters per microsecond—mm/us) in the material and inversely related to frequency (in megahertz—MHz).

$$\text{Wavelength (mm)} = \frac{\text{Propagation velolicy(mm/us)}}{\text{Frequency (Megahertz — MHz)}}$$

Published data of velocities of wave propagation in various materials comprises:

TABLE III

| MATERIAL | PROPAGATION VELOCITY (MM/US) |
|---|---|
| AIR | 0.344 |
| ALCOHOL | 1.170 |
| GASOLINE | 1.25 |
| TURPENTINE | 1.255 |
| GLYCOL (POLYETHYLENE) | 1.62 |
| WATER AT 25 DEGREES C. | 1.4967 |
| ALUMINUM (6061-T651 PLATE) | 6.330 |
| POLYURETHANE (RP-6403) | 1.87 |
| PLASTIC (ACRYLIC, PLEXIGLASS) | 2.75 |
| EPOXY (HYSOL EE4183) | 2.92 |
| SILICONE (DOW SYLGARD 184) | 1.027 |
| OILS (DOW 200) | 0.98 |
| QUARTZ (GE 124) | 5.918 |
| GLASS (PYREX) | 5.64 |

TABLE III-continued

| MATERIAL | PROPAGATION VELOCITY (MM/US) |
|---|---|
| TANTALUM | 4.10 |
| STAINLESS STEEL (#347) | 5.79 |
| SILVER | 3.6 |

EXAMPLE FOR QUARTZ (GE 124):

$$\text{ONE WAVELENGTH} = \frac{5.918\ (\text{mm/us})}{.85\ \text{MHz})} = 6.962\ \text{mm} = .2741\ \text{inches}$$

Acoustic impedance (in MRayls) of materials is important to transducer 29, and is particularly important for the water of liquid solution 12, and for the silicone elastomer encapsulation layer 46. Acoustic impedance (in MRayls) is directly related to the density of the material (in grams per cubic centimeter—g/cc) and to the propagation velocity (in millimeters per microsecond—mm/us).

$$\text{Acoustic Impedance } (MRayls) = \text{Density } (g/cc) \times \text{Propagation Velocity } (mm/us)$$

The liquid solution 12, being a water based solution, has an acoustical impedance substantially the same as the acoustical impedance of water, i.e., 1.5 MRayls. As indicated above, the isolation layer or quartz window 35 has a thickness equaling one-half wavelength of the operating frequency of the acoustical energy in the isolation layer 35, i.e., 850 KHz or a thickness of 0.137 inch. Because the thickness of the isolation layer 35 is one-half wavelength, the impedance characteristic of the water at the load side 35B of the isolation layer 35 is transferred or replicated at the supply side 35C of the isolation layer which faces the piezo crystal 43. Accordingly, the propagation of the high frequency acoustic energy through the isolation layer 35 is effected with minimal losses.

Similarly, because the liquid coupling layer 38 has a thickness of a multiple of one-half wavelengths, or an even number of quarter wavelengths, and more particularly a thickness equaling two and one-half wavelengths of the acoustic energy being propagated through the coupling layer 38 and an actual thickness of 0.173 inch, the transmission of high frequency acoustic energy at 850 KHz is effected through the coupling layer 38 with minimal losses. Thickness of coupling layer 38 may be adjusted to accommodate adequate liquid flow for cooling if the thickness remains an-even number of one-quarter wavelengths of the energy propagated through the layer 38. Again, because of the thickness equaling an even number of one-quarter wavelengths in the coupling layer 38 to minimize the effect on impedance at the coupling layer, the impedance characteristic at one side 38B of the coupling layer is simply transferred and replicated at the other side 38C; and whereas the impedance characteristic of water is replicated at the supply side 35C of the isolation layer 35, engaged by the liquid coupling layer 38, the impedance characteristic of water is again transferred and replicated at the side 38C of the liquid coupling layer which bears against the encapsulation layer 46 of the piezo electrical crystal assembly 36.

The encapsulation layer 46 of silicone elastomer has a thickness equaling three one-quarter wavelengths, i.e., $\frac{3}{4}$ wavelengths, or an odd number of one-quarter wavelengths of the high frequency acoustic energy being propagated through the encapsulation layer 46, or an actual thickness of 0.035 inch (0.089 cm), which transforms the impedance at the input side 46B of the encapsulation layer engaging the piezo crystal 43 into a different impedance at the output side 46A (the hydrophillic surface) of the encapsulation layer 46 which engages the liquid coupling layer 38 according to a basic mathematical relationship. Accordingly, the thickness of the encapsulation layer 46, an odd number of one-quarter wavelengths, together with the acoustical impedance of the encapsulation layer 46 of less than that of water, i.e., less than 1.5 MRayls of water, serves the purpose of transitioning between the impedance at the output side 46A of the encapsulation layer engaging the coupling layer and the impedance of the piezo crystal at the input side 46B of the encapsulation layer 46, and influences and increases the electrical impedance of the transducer to improve the electrical matching between the transducer and the power supply at 50 ohms at the anti-resonant frequency. With constant power input to the transducer, the higher electrical impedance results in a higher voltage appearing across the crystal 43. It appears that for a given configuration of transducer, and a given power level, the higher voltage would appear to increase the acoustic output.

It is important that the piezo crystal 43 has unique characteristics which must be accommodated in the transducer 29. The acoustic impedance characteristic of the piezo crystal 43 gradually decreases as frequency is increased until a minimum impedance is experienced at approximately the resonant frequency of the crystal. As frequency is increased above resonant frequency, the phase of the crystal rises sharply and then falls sharply at the antiresonant frequency; and as the frequency rises from the resonant frequency to the antiresonant frequency, the acoustic impedance increases rapidly and peaks at substantially the antiresonant frequency after which the impedance again falls off gradually as frequency is further increased.

At the backsides of the piezo crystals 43, the thicknesses of the bonding layer 45 and of the aluminum backing layer 44 are set to minimize the influences of the thicknesses of the bonding layer 45 and of the aluminum backing layer 44 on each other as to minimize the effect of these layers upon the electrical characteristics of the piezo crystals 43. More specifically, the thickness of the bonding layer is set at one-quarter wavelength of the operating frequency in the bonding layer to center the electrical characteristics at the operating frequency of 850 KHz. The thickness of the backing layer 44 is set at one and one-quarter wavelengths to make it appear acoustically that the back of the crystal is directly exposed to the air in the space 50 behind the aluminum backing layer. Alternately the minimizing of the effect of the thicknesses of the bonding layer 45 and the thickness of the metal backing layer 44 on each other can also be minimized by making each of these thicknesses an even number of one-quarter wavelengths, rather than making both of the thicknesses an odd number of one-quarter wavelengths as preferred and as defined hereinabove.

Whereas it is preferred to maintain the transducer and the piezo crystal 43 at the operating frequency of 850 KHz, so that the acoustic output is substantially at a maximum with the dimensions of the acoustic materials described herein as defined, the frequency of the piezo crystal may vary within about 15 KHz above or below the desired frequency before the response and propagation of the energy with minimal losses falls off rapidly.

In operating the transducer 29, consideration is necessarily given to the electrical impedance of the transducer and particularly the piezo crystals 43. The electrical impedance, including its phase characteristic, i.e., the relationship of the applied voltage and resulting current, must be controlled such that a zero phase point coincides with the desired operating frequency of the transducer. This zero phase point is the point at which maximum real power is delivered to the transducer. Two frequencies, the resonant frequency (fr) and the antiresonant frequency (fa) specify the zero phase points of the impedance according to the resonant and antiresonant frequencies respectively. However, the maximum acoustic output generally occurs near the antiresonant frequency.

Preferably, the transducer should have an electrical impedance close to 50 ohms at the operating frequency and, to minimize measurement errors in measuring the power applied, the impedance should be within 25% on either side of the desired 50 ohm impedance.

Figure 11:
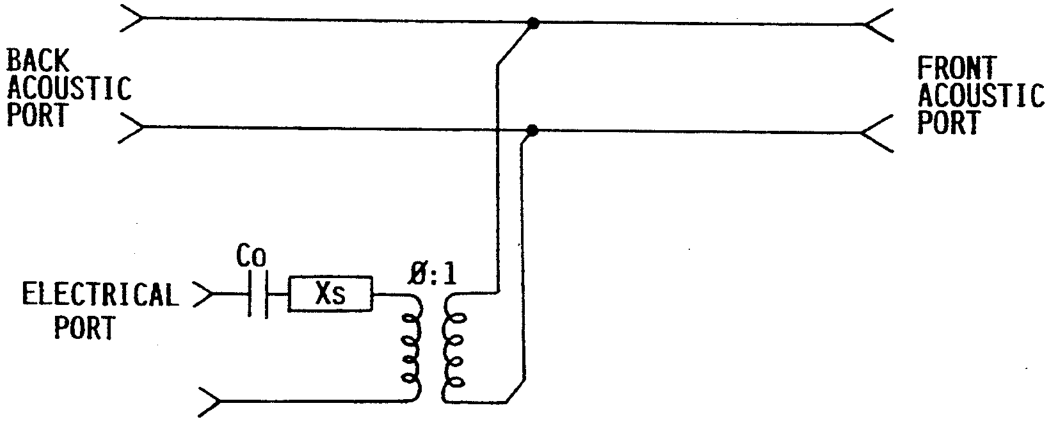
FIG. 11 is a schematic diagram of a KLM transmission line model used in computer modeling of the megasonic transducers of this disclosure.

The substantial improved operating characteristics of the liquid coupled transducer 29 is verified by computer modeling of a number of different transducers using various materials between the piezo crystal and the liquid solution in which the substrates are immersed. Computer modeling shows good alignment of the acoustic and electrical characteristics. The relationship between the acoustic and electrical characteristics of various transducers can be determined by using a KLM transmission line model for transducers, named for its originators, Krimholtz, Leedom and Matthaei. This KLM transmission line model allows the computer simulation of different configurations and material properties. The KLM transmission line model is illustrated in FIG. 11. By using a computer program based on the KLM transmission line model in evaluating a number of different transducer types, the liquid coupled transducer 29 according to the present invention was confirmed to have improved acoustic and electrical characteristics as compared to other transducers including a tantalum transducer like FIG. 2, and a bonded quartz configuration of transducer.

As an alternative to mounting the transducer 29 at the bottom of vessel 11 as illustrated in FIGS. 3–8, the transducer may also be mounted in any of the upright sidewalls 11, or may be mounted in the top of the vessel with the quartz isolation layer 35 immersed at least slightly into the liquid 12 so as to direct the megasonic acoustic energy to the immersed wafers or substrates. Operation of the transducer in this alternate location and orientation is substantially the same as described above.

Figure 9:
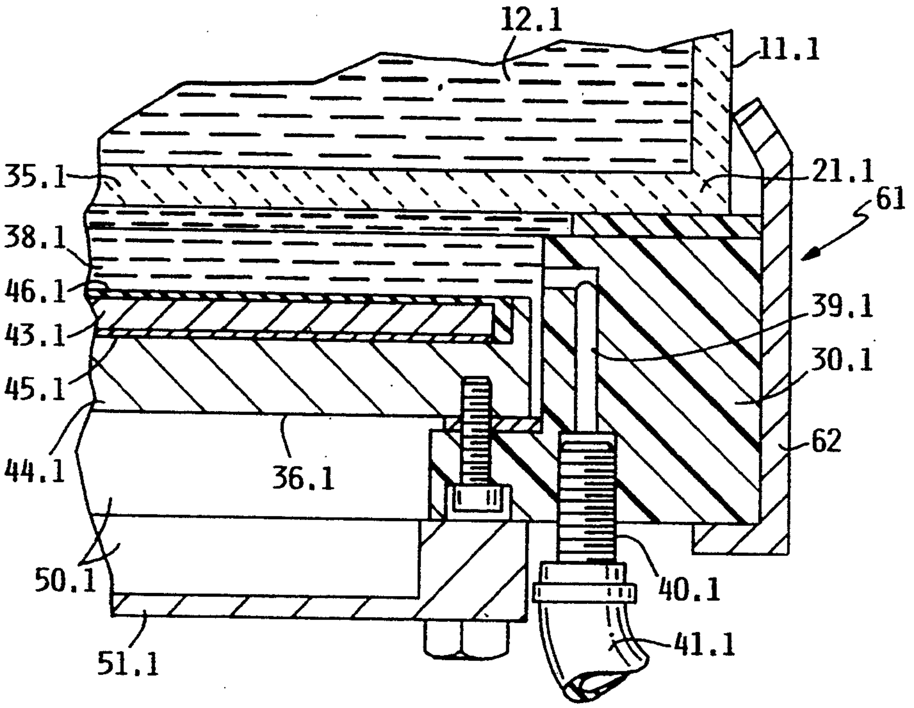
FIG. 9 is a detailed section view generally similar to FIG. 4, but illustrating a slightly modified form of the invention wherein the transducer directs the megasonic energy through the quartz wall of the container for the cleaning solution in which the substrates are immersed.

An alternate form of transducer 61 is illustrated in FIG. 9, and is very similar to the transducer of FIGS. 3–8. The principal distinction in the transducer 61 is that the quartz layer or isolation layer 35.1 is integral with the bottom wall 21.1 of the tank or vessel 11.1 which contains the liquid solution 12.1 in which the substrates are immersed. This construction is in contrast to that of transducer 29 wherein the quartz panel or isolation layer 35 is separate from the bottom wall 21 of the tank 11.

In the transducer 61, the quartz or isolation layer 35.1 has a thickness equal to one-half wavelength of the high frequency acoustical energy being propagated through the isolation layer. The liquid coupling layer 38.1 in transducer 61 has a thickness equaling an even number of one-half wavelengths of the high frequency acoustic energy propagated through the liquid coupling layer and more specifically, has a thickness equaling two and one-half wavelengths of the operating frequency being propagated through the liquid coupling layer 38.1, in order to provide reasonable flow of the coupling liquid in layer 38.1. The encapsulation layer 46.1 is substantially identical to the encapsulation layer 46 of transducer 29 and the encapsulation layer 46.1 has a thickness equaling an odd number of one-quarter wavelengths of the operating frequency being propagated through the encapsulation layer and more specifically, the encapsulation layer has a thickness equaling three one-quarter wavelengths of the high frequency acoustic energy being propagated through the encapsulation layer. The piezo crystal 43.1 is identical to the crystal 43 of transducer 29 and has the high frequency electrical energy applied thereto to cause generation by the piezo crystal of high frequency acoustic energy with a frequency equaling approximately 850 KHz.

The transducer 61 has a metal backing layer 44.1 identical to the backing layer 44 of transducer 29; and also has a bonding layer 45.1 identical to the bonding layer 45 of transducer 29. The bonding layer 45.1 has a thickness identical to the thickness of the bonding 45 of transducer 29, equaling one-quarter wavelength of the operating frequency propagated through the bonding layer; and the thickness of the metal backing layer 44.1 is identical to the thickness of the backing layer 44 of the transducer 29. The backing layer 44.1 and bonding layer 45.1 function identically to the functioning of the backing layer 44 and bonding layer 45 of transducer 29. It will be recognized in FIG. 11 that the transducer 61 also has a back cover 51.1 enclosing an air space 50.1 into which the high frequency acoustic energy emanating from the back side of the crystal and of the transducer is received. Also, as in the transducer 29, transducer 61 has a flow passage 39.1 connected to a fitting 40.1 and a flow tube 41.1 to accommodate flowing of the liquid coupling layer 38.1 during operation of the transducer. In the transducer 61, the frame 30.1 which supports the piezo crystal 43.1 and the piezo crystal assembly 36.1 is supported from the container or vessel 11.1 by a suitable supporting bracket 62 which will extend around the entire perimeter of the frame 30.1 and of the container 11.1.

Functioning of the transducer 61 is identical to that of the transducer 29. Of course, the bottom wall 21.1 of the vessel 11.1 may be formed integrally of the sidewalls of the vessel, or might be formed as a separate piece simply attached to the sidewalls.

An alternate form of transducer 63 is illustrated diagrammatically in FIG. 10 and is identical to the transducer 29 of FIGS. 3–8 with the exception that the liquid coupling layer 38 of transducer 29 is eliminated. As in transducer 29, the transducer 63 has a quartz isolation layer 35.2 with a thickness of one-half wavelength, an encapsulation layer 46.2 formed of a material with an acoustic impedance equal to or less than the acoustic impedance of water, i.e., equal to or less than 1.5 MRayls; a piezo electric crystal 43.2 to which high frequency electrical energy is applied and generates high frequency acoustic energy propagated through the encapsulation layer 46.2 and quartz layer 35.2 at a frequency substantially equal to 850 KHz. Transducer 63 also comprises a metal backing layer 44.2 of rigid aluminum with a thickness equaling one and one-quarter wavelengths of the high frequency acoustic energy propagated through the backing layer 44.2; and a bonding layer adhering the backing layer 44.2 to the piezo crystal 43.2 and having a thickness equaling one-quarter wavelength of the operating frequency propagated through the bonding layer.

The functioning of the transducer 63 is substantially identical to the functioning of the transducer 29 of FIGS. 3–8 except that cooling obtained by the liquid layer 38 of transducer 29 is not obtained and may be provided in other ways, such as by cooling passages in the frame through which cooling water may be circulated.

In the transducer 63, the acoustic energy transmitting means 38AA which comprises the encapsulation layer 46.2 lying flush against the quartz layer 35.2 and against the piezo crystal 43.2 minimizes any change in the acoustic impedance between the encapsulation layer and the isolation layer because the encapsulation layer lies directly against the isolation layer 35.2.

Similarly, in the transducer 29 of FIGS. 3–8, the acoustic energy transmitting means 38A, i.e., layers 38 and 46, encapsulating the front faces of the piezo crystals and acoustically coupling the piezo crystal to the isolation layer 35 minimizes any change in acoustic impedance between the encapsulation layer 46 and the isolation layer 35 because the thickness of the liquid coupling layer 38 equals an integral number of one-half wavelengths of the operating frequency being propagated through the liquid coupling layer. Accordingly, because the thickness of the liquid coupling layer 38 in transducer 29 has a thickness of one-half wavelength of the operating frequency and because the transducer 63 has the encapsulation layer 46.2 lying flush against the quartz isolation layer 35.2, both of the transducers 29 and 63 minimize any change in acoustic impedance between the encapsulation layer and the isolation layer. In both transducers 29 and 63, the encapsulation layers 46 and 46.2, respectively, have thicknesses equaling odd numbers of one-quarter wavelengths and more particularly, three one-quarter wavelengths of the operating frequency and both the encapsulation layers 46 and 46.2 are formed of a material which has the acoustic impedance of water or less. The operation of the transducers 29 and 63 are substantially identical to each other.

With respect to the transducer 63 of FIG. 10, the encapsulation layer 46.2 may be made of any of the silicone elastomers previously identified in connection with encapsulation layer 46; and in the transducer 63, the encapsulation layer 46.2 may also be formed of any of a number of liquid materials which have the necessary characteristics.

The principal required characteristics of the encapsulation layer 46.2 is that the material in the encapsulation layer be electrically non-conductive and also have an acoustical impedance equal to or less than the acoustical impedance of water, 1.5 MRayls. A number of liquids also qualify with these characteristics and those liquids are identified as follows:

TABLE IV

SUITABLE LIQUIDS FOR ENCAPSULATION LAYER

| Material Identification | Source | Acoustic Material Impedance |
|---|---|---|
| Silicon Oils-Electrically Non-Conductive | | |
| Oil, silicon Dow 200,1 centistoke | Dow Chemical | 0.74 |
| Oil, silicon Dow 200, 10 centistoke | Dow Chemical | 0.91 |
| Oil, silcon Dow 200, 100 centistoke | Dow Chemical | 0.95 |
| Oil, silicon Dow 200, 1000 centistoke | Dow Chemical | 0.96 |
| Oil, silicon Dow 704 @ 79F | Dow Chemical | 1.437 |
| Fluorinated Liquids-Chemically Inert and Electrically Non-Conductive | | |
| Fluorinert FC-40 | 3 M | 1.19 |
| Fluorinert FC-70 | 3 M | 1.33 |
| Fluorinert FC-72 | 3 M | 0.86 |
| Fluorinert FC-75 | 3 M | 1.02 |
| Fluorinert FC-77 | 3 M | 1.05 |
| Fluroinert FC-104 | 3 M | 1.01 |

The choice of material used in the encapsulation layer 46 in the transducer 29 of FIGS. 3–8, and the encapsulation layer 46.1 of transducer 61 in FIG. 9, and the acoustic layer 46.2 of transducer 63 in FIG. 10, may be selected from a range of materials provided that the materials have other required characteristics, including the electrical non-conductivity and the thickness equaling an odd number of one-quarter wavelengths of the operating frequency, and particularly within the range of 1 to 7 odd number one-quarter wavelengths; and in the transducers eliminating the liquid coupling layers, such as the transducer 63 of FIG. 10 wherein the encapsulation and coupling layer 46.2 engages both the isolation layer 35.2 and the piezo crystal 43.2. The material in the encapsulation and coupling layer 46.2 may be selected from a broader range of materials including solids such as the silicone elastomers, the silicon oils, and the fluorinate liquids as set forth.

The present invention also involves a method substantially optimizing the transfer of megasonic acoustic energy from a piezo crystal to a water based liquid solution for cleaning surfaces of substrates immersed in the solution. The method comprises a number of steps comprising applying high frequency electrical energy to a piezo crystal at a frequency in the range of approximately 0.5 MHz to 2.5 MHz to cause generation and propagation of high frequency acoustic energy at the front and back faces of the piezo crystal. Preferably the application of high frequency electrical energy should be within a narrow range as to cause the acoustic energy generated to correspond to the desired wavelength relationships to provide optimum performance of the transducer configuration.

The method also comprises attaching a rigid backing layer, preferably aluminum, to the back side of the piezo crystal by a bonding layer, preferably of silicone adhesive interposed between the backing layer and the back side of the piezo crystal, the rigid backing layer having an outer side exposed to air and an inner side, the bonding layer having opposite side respectively engaging and adhered to the back face of the crystal and to the inner side of the rigid backing layer, the acoustic impedances at the transmitted frequency and at the inner side and the outer side of the rigid backing layer being different from each other, and establishing the thickness of the rigid aluminum backing layer to be an odd number of one-quarter wavelengths of the transmitted frequency and preferably one and one-quarter wavelengths of the transmitted frequency, and the acoustical impedances at the transmitted frequency and at opposite sides of the bonding layer being significantly different than each other, the thickness of the bonding layer being established at an odd number of one-quarter wavelengths of the transmitted frequency and preferably the thickness of the bonding layer should be one-quarter wavelength of the transmitted frequency, whereby the thicknesses of the bonding layer and of the backing layer minimize the effect of the bonding and backing layers upon the electrical characteristics of the piezo crystal and thereby minimize the change in the impedance of the piezo crystal and minimize any frequency shift of the frequency at which the piezo crystal operates.

The method also comprises mounting and sealing an isolation layer, preferably made of quartz, between the liquid solution in which the substrates are immersed and the piezo crystal, the quartz isolation layer comprising a load side engaging the liquid solution and also comprising a supply side facing the piezo crystal, and selecting the material of the isolation layer, preferably quartz, to be acoustically transparent and resistant to the deteriorating effects of corrosive chemicals, establishing the thickness of the quartz isolation layer to be an integral number of one-half wavelengths of the acoustic energy transmitted to the isolation layer, preferably one-half wavelength of the transmitted frequency whereby to minimize a loss of acoustic energy and maximizing the transmission of acoustic energy through the isolation layer.

The method also comprises coupling the front face of the piezo crystal to the supply side of the fourth isolation layer by interposing an electrically insulating encapsulation layer between the front face of the piezo crystal and the isolation layer, the encapsulation layer comprising an input side engaging the front face of the piezo crystal and also comprising an output side facing the isolation layer, selecting a material for the encapsulation layer which has an acoustical impedance less than the acoustical impedance of water, i.e., 1.5 MRayls, and adjusting the thickness of the encapsulation layer to be equal to an odd number of one-quarter wavelengths of the high frequency acoustic energy propagating through the encapsulation layer and preferably equal to three one-quarter wavelengths of the transmitted frequency, substantially eliminating air between the encapsulation layer and the isolation layer and eliminating air in the encapsulation layer, and minimizing any change in the acoustical impedance between the acoustic impedance at the output side of the encapsulation layer and the acoustical impedance at the supply side of the isolation layer, by either arranging the encapsulation layer to lie flush against the quartz isolation layer or by interposing a layer of deionized water or other suitable liquid to eliminate air and provide cooling between the encapsulation layer and the quartz isolation layer, causing the water in the liquid coupling layer to circulate and establishing the thickness of the liquid coupling layer to be an integral number of one-half wavelengths of the transmitted frequency and preferably to liquid coupling layer should be established at $2\frac{1}{2}$ wavelengths of the transmitted frequency, or another thickness equaling an even number of one-quarter wavelengths to accommodate flow necessary for adequate cooling.

The present invention may be embodied in other specific forms without departing from the spirit or essential attributes thereof; therefore, the illustrated embodiment should be considered in all respects as illustrative and not restrictive, reference being made to the appended claims rather than to the foregoing description to indicate the scope of the invention.

What is claimed is:

1. A megasonic acoustic transducer to generate and direct megasonic acoustic energy into and through a water based liquid solution for cleaning substrates immersed therein, comprising a source of high frequency electrical energy in the range of 0.5 to 2.0 Megahertz, acoustic energy generating means connected to said source of high frequency electrical energy and comprising a piezo crystal having a front face and a back face and propagating megasonic frequency acoustic energy from both the front face and the back face, a backing means adjacent the back side of said piezo crystal and supporting and conducting heat away from said megasonic acoustic energy generating means and propagating high frequency acoustic energy from the piezo crystal, said backing means comprising a rigid backing layer, and said backing means also comprising a bonding layer between and adhering to the rigid backing layer and to the piezo crystal, the bonding layer and the rigid backing layer having thicknesses to influence each other in the propagation of megasonic acoustic energy and contribute to optimizing the effect of the backing means on the electrical characteristics of the piezo crystal, an acoustically transparent isolation means resistant to the deteriorating effects of corrosive chemicals, said isolation means engaging the water based liquid solution and propagating the megasonic frequency acoustic energy from the acoustic energy generating means and into the liquid solution, and said isolation means isolating the acoustic energy generating means from the liquid solution, the isolation means comprising an isolation layer having a load side and a supply side opposite each other, the supply side facing the acoustic energy generating means and the load side facing the water based liquid solution and comprising an acoustic impedance characteristic, the isolation layer having a uniform thickness between the load side and the supply side and substantially equaling an even number of one-quarter wavelengths of the megasonic acoustic energy propagated through the isolation layer to transfer the acoustic impedance characteristic existing at the load side and replicate said acoustic impedance characteristic at the supply side of the isolation layer, an acoustic energy transmitting means encapsulating the front face of the piezo crystal and acoustically coupling the piezo crystal to the isolation layer and also eliminating air between the piezo crystal and the isolation layer, said acoustic energy transmitting means comprising an encapsulation layer adjoining the front face of the piezo crystal and formed of an electrically insulating material and said acoustic energy transmitting means minimizing any change in acoustic impedance between the encapsulation layer and the isolation layer.

2. A megasonic acoustic transducer according to claim 1 wherein the encapsulation layer has a thickness approximately equaling an odd number of one-quarter wavelengths of the megasonic frequency of the acoustic energy propagated in the encapsulation layer, and said encapsulation layer has an acoustic impedance less than the acoustic impedance of water, whereby to increase the electrical impedance of the acoustic energy generating means and also increase the voltage across the acoustic energy generating means at a given power level.

3. A megasonic acoustic transducer according to claim 2 wherein the number of one-quarter wavelengths in the thickness of said encapsulation layer is an odd number between and including one and seven.

4. A megasonic acoustic transducer according to claim 1 wherein said acoustic energy transmitting means also comprises a liquid coupling layer between and engaging both of the isolation layers and the encapsulation layer and having a thickness substantially equaling an even number of one-quarter wavelengths of the megasonic frequency acoustic energy in the liquid coupling layer to minimize any change in acoustic impedance between the encapsulation layer and the isolation layer.

5. A megasonic acoustic transducer according to claim 1 wherein said encapsulation layer lies flush against the isolation layer to minimize any change in acoustic impedance between the encapsulation layer and the isolation layer.

6. A megasonic acoustic transducer according to claim 1 wherein megasonic frequency acoustic energy generated and propagated by the piezo crystal comprises a frequency within the range of 835 Kilohertz and 865 Kilohertz.

7. A megasonic acoustic transducer according to claim 6 wherein said megasonic frequency is approximately 850 Kilohertz.

8. A megasonic acoustic transducer according to claim 1 wherein the electrical impedance of said transducer comprises an impedance within the range of 37.5 ohms and 62.5 ohms.

9. A megasonic acoustic transducer according to claim 1 wherein the thickness of the bonding layer comprises a first number of one-quarter wavelengths of the megasonic frequency of the acoustic energy in the bonding layer, and the thickness of the rigid backing layer comprises a second number of one-quarter wavelengths of the megasonic frequency of the acoustic energy in the rigid backing layer, said first and second numbers being both odd numbers or both even numbers.

10. A megasonic acoustic transducer according to claim 9 wherein both of said first and second numbers are odd numbers.

11. A megasonic acoustic transducer according to claim 9 wherein both of said first and second numbers are even numbers.

12. A megasonic acoustic transducer according to claim 4 wherein said encapsulation layer is formed of a silicone elastomer having an acoustical impedance less than approximately 1.5 MRayls.

13. A megasonic acoustic transducer according to claim 12 wherein said silicone elastomer has an acoustic impedance of approximately 1.0 MRayls.

14. A megasonic transducer according to claim 1 wherein said silicone elastomer has an acoustical impedance of approximately 0.9 to 1.4 MRayls.

15. A megasonic acoustic transducer according to claim 5 wherein said encapsulation layer is formed of a material selected from a class of materials comprising silicone elastomers, silicon oils and fluorinated liquids.

16. A megasonic transducer according to claim 1 wherein the rigid backing comprising a thickness approximately equaling a number of one-quarter wavelengths of the frequency propagated in the backing and where said number comprises an odd number of seven or less.

17. A megasonic transducer according to claim 1 wherein the bonding layer comprises a thickness approximately equaling a number of one-quarter wavelengths of the frequency propagated in the bonding layer and wherein said number comprises an odd number of seven or less.

18. A megasonic acoustic transducer to generate and direct megasonic acoustical energy into and through a water based liquid solution for cleaning substrates immersed therein, comprising a source of high frequency electrical energy having a frequency in the range of 835 Kilohertz to 865 Kilohertz and an electrical impedance of approximately 50 ohms, acoustic energy generating means connected to said source of high frequency electrical energy and comprising a plurality of piezo crystals having front faces and back faces and propagating megasonic frequency acoustic energy from both the front faces and the back faces, said piezo crystals being elongate and lying in closely spaced side-by-side relation, a said pair of piezo crystals being connected in parallel, a backing means adjacent to the back side of said piezo crystals and a supporting end conducting heat away from said acoustic energy generating means and propagating the megasonic frequency acoustic energy from the piezo crystals, said backing comprising a rigid aluminum backing layer, and said backing means also comprising a silicone adhesive bonding layer between and adhering to the aluminum backing layer and to the piezo crystals, the aluminum backing layer having a thickness substantially equaling one and one-quarter wavelengths of the megasonic frequency acoustic energy propagated through the aluminum backing layer, and the bonding layer having a thickness substantially equaling one-quarter wavelength of the megasonic frequency acoustic energy propagated through the bonding layer, the thicknesses of the bonding layer and aluminum backing layer contributing to optimizing the effect of the backing means on the electrical characteristics of the piezo crystal, an acoustically transparent isolation means resistant to the deteriorating effects of the corrosive chemicals, said isolation means engaging the water based liquid solution and propagating megasonic frequency acoustic energy from the acoustic energy generating means and into the liquid solution, and said isolation means isolating the acoustic energy generating means from the liquid solution, the isolation means comprising an isolation layer of acoustically transparent quartz resistant to the deteriorating effect of corrosive chemicals and having a thickness substantially equaling a one-half wavelength of the high frequency acoustic energy propagating through the isolation layer, and an acoustic energy transmitting means encapsulating the front faces of the piezo crystals and acoustically coupling the piezo crystals to the isolation layer while eliminating air between the piezo crystals and the isolation layer, said acoustic energy transmitting means comprising an electrically insulating silicone elastomer encapsulation layer engaging the front face of the piezo crystals, said silicone elastomer encapsulation layer having an acoustical impedance of approximately one MRayl and a thickness approximately equaling three one-quarter wavelengths of the megasonic frequency of the acoustic energy propagating through the encapsulation layer whereby to increase the electrical impedance of the acoustic energy generating means to about 50 ohms to nearly match the impedance of the source, and said acoustic energy transmitting means also comprising a water based liquid coupling layer between and engaging both of the encapsulation layer and the isolation layer and removing air therebetween, the liquid coupling layer having a thickness approximately equaling two and one-half wavelengths of the high frequency acoustic energy propagating through the liquid coupling layer.

* * * * *

UNITED STATES PATENT AND TRADEMARK OFFICE

CERTIFICATE OF CORRECTION

PATENT NO. : 5,355,048

DATED : October 11, 1994

INVENTOR(S) : Bruce M. Estes

It is certified that error appears in the above-indentified patent and that said Letters Patent is hereby corrected as shown below:

Column 4, line 32, delete "wafers" and insert --wafer carrier--.

Column 4, line 30, "wafers carriers" should be --wafers--.

Signed and Sealed this

Twenty-third Day of May, 1995

Attest:

BRUCE LEHMAN

*Attesting Officer* *Commissioner of Patents and Trademarks*